US006704243B2

(12) United States Patent
Kho et al.

(10) Patent No.: US 6,704,243 B2
(45) Date of Patent: Mar. 9, 2004

(54) APPARATUS FOR GENERATING MEMORY-INTERNAL COMMAND SIGNALS FROM A MEMORY OPERATION COMMAND

(75) Inventors: Rex Kho, Holzkirchen (DE); Paul Schmoelz, München (AT); Andreas Taeuber, Unterschleissheim (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/266,187

(22) Filed: Oct. 7, 2002

(65) Prior Publication Data

US 2003/0081470 A1 May 1, 2003

(30) Foreign Application Priority Data

Oct. 5, 2001 (DE) .......................................... 101 49 192

(51) Int. Cl.[7] .................................................. G11C 8/00
(52) U.S. Cl. ............. 365/233; 365/189.11; 365/189.12; 365/191; 365/230.06
(58) Field of Search ........................... 365/233, 230.06, 365/189.12, 189.11, 191

(56) References Cited

U.S. PATENT DOCUMENTS

| | | | | |
|---|---|---|---|---|
| 6,055,209 A | * | 4/2000 | Abo | 365/233 |
| 6,307,806 B1 | * | 10/2001 | Tomita et al. | 365/233 |
| 6,449,674 B1 | * | 9/2002 | Yun et al. | 710/260 |

* cited by examiner

*Primary Examiner*—Richard Elms
*Assistant Examiner*—Pho Luu
(74) *Attorney, Agent, or Firm*—Laurence A. Greenberg; Werner H. Stemer; Gregory L. Mayback

(57) ABSTRACT

A device for generating memory-internal command signals from a memory operation command includes a command input for receiving a memory operation command for performing a memory operation in a memory system, a clock signal input for receiving an external clock signal, and an output for applying the memory-internal command signal to a command signal line of the memory system. In the device, the memory-internal command signal is generated at a time which depends on the memory-internal command signal and which is selectively settable and synchronous with a rising or synchronous with a falling edge of the external clock signal.

8 Claims, 4 Drawing Sheets

APPARATUS FOR GENERATING MEMORY-INTERNAL COMMAND SIGNALS FROM A MEMORY OPERATION COMMAND

BACKGROUND OF THE INVENTION

1. Field of the Invention

The present invention generally relates to the field of memory systems and in particular to the field of means for generating memory-internal command signals for memory systems.

2. Description of the Related Art

In memory systems, like for example a DRAM memory (DRAM=dynamic random access memory) typically several subprocesses have to be carried out in the memory system for performing a memory operation, as for example a read operation, a write operation or an update operation. Such subprocesses for example include an activation of a memory bank, an activation of row address lines, an activation of a read process or a write process or a precharging, in order to bring the memory system for the next memory operation into an available state.

These processes need to be performed with delays time matched to each other, in order to avoid conflicts resulting from a too early or too late triggering of the processes.

Typically, a command decoder is used for controlling these time matched storage processes, which is connected to a command line, like for example a command bus line, on the input side for receiving memory operation commands and connected to internal command signal lines of the memory system on the output side for outputting commands associated with the respective subprocesses.

The command for performing a memory operation is thereby applied to the input of the command decoder via the command line, wherein the command decoder thereupon creates one or several memory-internal command signals which are applied to internal command signal lines of the memory system.

FIG. 1 shows a known command decoder, wherein one command input 110 is connected to several delay units 112a, 112b, 112c. Each of the delay units 112a, 112b and 112c is connected to a first input of the AND logic elements 116a, 116b, 116c, respectively, via the signal lines 114a, 114b, 114c, respectively.

Second inputs of the AND logic elements 116a–116c are further connected to a clock signal input 120 via a signal line 118. Furthermore, the outputs of the AND logic elements 116a–116c are connected to memory-internal command signal lines 122a, 122b, 122c, respectively. In the known command decoder according to FIG. 1 a memory-internal ACTIVATE command signal is transmitted via the command signal line 122a, a memory-internal WRITE command signal is transmitted via the command signal line 122b and a memory-internal PRECHARGE command signal is transmitted via the command signal line 122c.

A command is input to the command input 110 via a command line, wherein the command causes the delay units 112a–112c to be activated. The delay units 112a–112c thereby are implemented such that a respective delay unit generates an output signal at the outputs 114a–114c after a respective time period T1, T2 and Tn associated with it, with respect to the time or points of time of applying the command to the command input 110. This is performed in that a delay unit, for example delay unit 112a pulls or sets the output line associated with it, i.e. line 114a in the above example, from a logical low state to a logical high state.

The output signals are applied to the first inputs of the AND logic elements 116a–116c via the signal lines 114a–114c. Thereafter, AND-operations with an external clock signal, i.e. more precisely with a state of the line 118 which is determined by the external clock signal, are performed in the AND logic elements 116a–116c. The clock signal is thereby applied to the line 118 connected to the respective second inputs of the logic elements 116a–116c via the clock signal input 120.

The AND-operation to the external clock signal causes that the time-delayed output signals of the delay units 112a–112c are time-synchronized with the external clock signal, so that time-delayed memory-internal command signals are generated at the outputs of the AND logic elements 116a –116c which are time-matched to one of the signal edges of the external clock signal, i.e. either to the rising edge of the external clock signal or the falling edge of same.

The delay values T1, T2, Tn, respectively, of the time delay units 112a–112c are each determined according to the command signals generated by same. By the delay unit 112, for example, a time delay for an activate command signal is determined, wherein the time delay T1 is selected depending on the time at which the memory-internal ACTIVATE command signal is to be applied via the command signal line 122a of the memory system. Accordingly, the delay value T2 of the delay unit 112b is determined such that between the memory-internal WRITE command signal output at the command signal line 122 and the ACTIVATE command signal output at the command signal line 122a such a time delay results, which securely allows the memory system to be able to carry out a write action to the same after activating one or several memory cells of the memory system.

Consequently, the delay time values T1, T2, Tn need to be preset considering the type and the way of functioning of the memory system to which the known command decoder is connected, so that the processes triggered by the command signals are performed in the memory system without conflicts.

The selection of the delay values T1, T2, Tn, respectively, thereby needs to ensure, that at the time at which the command signal is applied to the memory system via the command signal lines 122a–122c, the memory system is ready to properly perform the process caused by the command signal at the memory system.

It is thereby disadvantageous that the performance of the memory systems may be slightly different from memory chip to memory chip. These fluctuations of the performance are caused by fluctuations of parameters in the manufacturing process and include, for example, fluctuations of the width of metallic conductor tracks, different dopant concentrations, etc. This results in different optimum times for generating a respective memory-internal command signal for each memory system.

It is therefore desirable for a certain memory system to generate the command signals close to the optimum time for each respective memory system in order to prevent excessive delays between successive command signals which might result in a bad performance and excessive operation times for performing the memory operation.

The known command decoder according to FIG. 1 thereby has the disadvantage that the delay units 112a–112c generate the respective delays asynchronous with the external clock signal. This means, that the time at which a respective line 114a–114c is set to a logical high state by the delay unit 112a–112c associated with it is not time-matched to the time, at which the clock signal line 118 is set to a logical high state by the external clock signal.

If, for example, the line 114a is pulled to a logical high state at a time shortly after the clock signal line 118 has been pulled to a logical low state, then the memory-internal command signal is only generated to a logical high state with the next transition of the clock signal line 118, i.e. about one clock period later. Consequently, it is not possible with the known command decoder to achieve a high time accuracy of generating the memory-internal clock signals.

Furthermore, it is not possible with the known command decoder to set and/or program the time of generating the memory-internal command signals. A settable delay is desirable, as the performance of the memory system may differentiate from chip to chip, as was mentioned above.

Additionally, with the known command decoder it is difficult to carry out a characterization, i.e. to determine which delays are optimum for the present memory chip. In order to carry out such a characterization of memory timing parameters, like for example a writeback, in the known command decoder, test methods need to be used in which the memory-internal command signals are shifted using more or less delays. These test methods are expensive and further not very accurate.

Therefore it is desirable to have a command decoder for a memory system in which the memory-internal command signals are generated close to the time which is optimum for the memory system and wherein further a simple characterization of decisive memory timing parameters is possible.

It is the object of the present invention to provide a concept which enables an improved and more flexible generation of memory-internal command signals.

SUMMARY OF THE INVENTION

The invention is a device for generating memory-internal command signals from a memory operation command, having:
- a command input for receiving a memory operation command for performing a memory operation at a memory system;
- a clock signal input for receiving an external clock signal;
- an output for applying a memory-internal command signal to a command signal line of the memory system; and
- a command signal generating means implemented to generate the command signal using the memory operation command at a time depending on the command signal and is selectively settable synchronous with the rising or synchronous with the falling edge of the external clock signal.

The invention is based on the findings that an improved and more flexible generation of memory-internal command signals in a command decoder is achievable by generating memory-internal command signals, which are generated using an applied memory operation command, synchronous with the rising or synchronous with the falling edge of an external clock signal.

It is an advantage of the present invention that a simple and time accurate characterization of memory timing parameters is performable.

In a preferred embodiment a coarse setting of the time of generating the memory-internal command signal is performed by a shift register which is connected to a multiplexer. At the input of the shift register, a command is input via the command line which causes that the first memory unit and/or the first flip-flop of the shift register is set to a high logical state. The shift register further receives an external clock signal which controls a shifting of the shift register. The inputs of the multiplexer are connected to predetermined data outputs of the memory units, wherein it is determined by applying a selection value to the multiplexer which of the memory units is switched to be active. Consequently, a first signal is output at an output of the multiplexer after a predetermined time delay, i.e. at a time at which the input memory value at a logical high state reaches the activated memory cell.

In the preferred embodiment the delay time is further fine-set by a clock signal selection means by generating the memory-internal command signal from the first signal of the multiplexer selectively with a rising edge or a falling edge of the external clock signal in response to a fine-setting selection signal.

It is an advantage of the preferred embodiment that the time of generating is settable or programmable.

BRIEF DESCRIPTION OF THE DRAWINGS

Preferred embodiments of the present invention are explained in more detail referring to the accompanying drawings in the following, in which.

DESCRIPTION OF THE PREFERED EMODIMENTS

Figure 1:
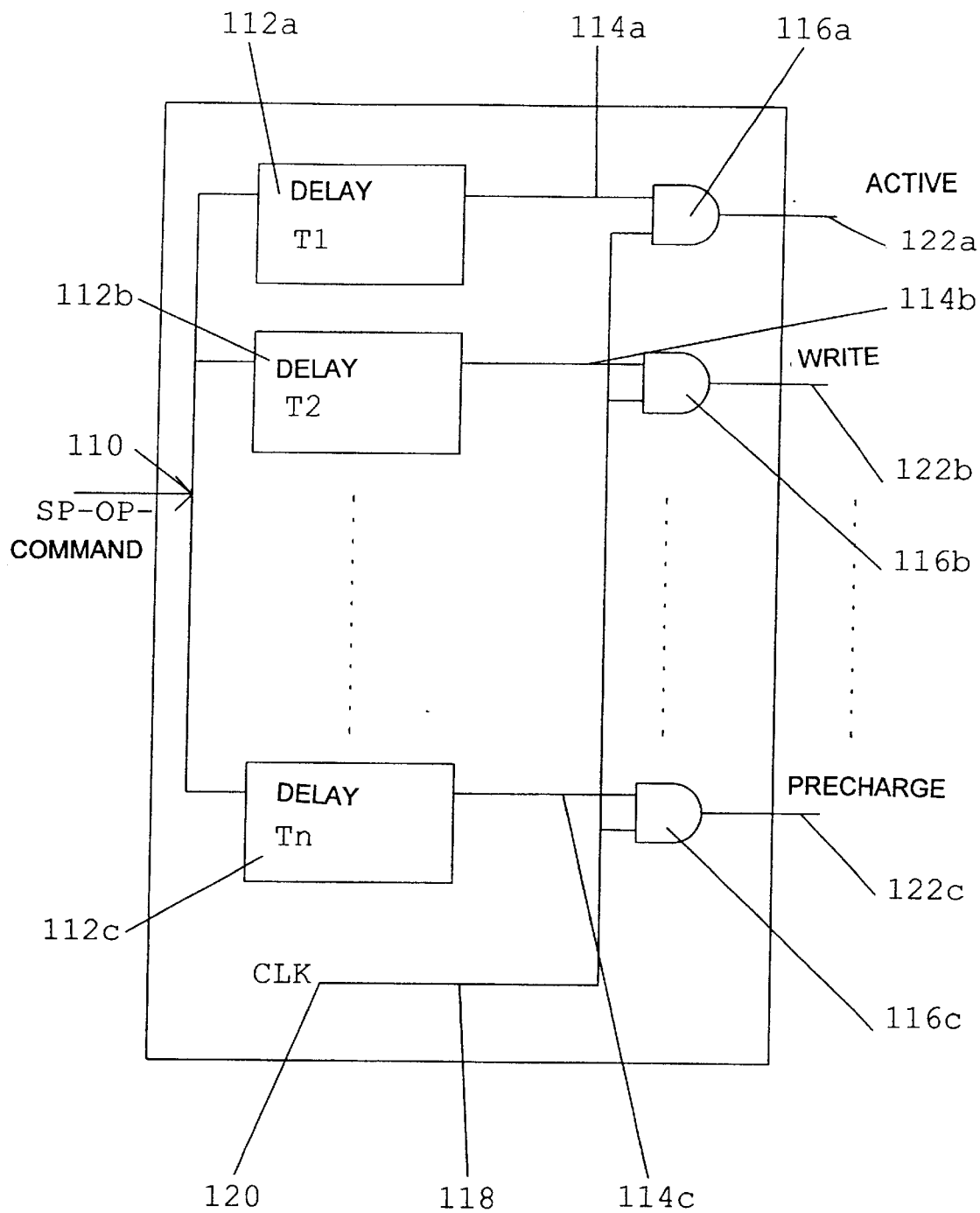
FIG. 1 shows a known command decoder for a memory system.
Figure 2:
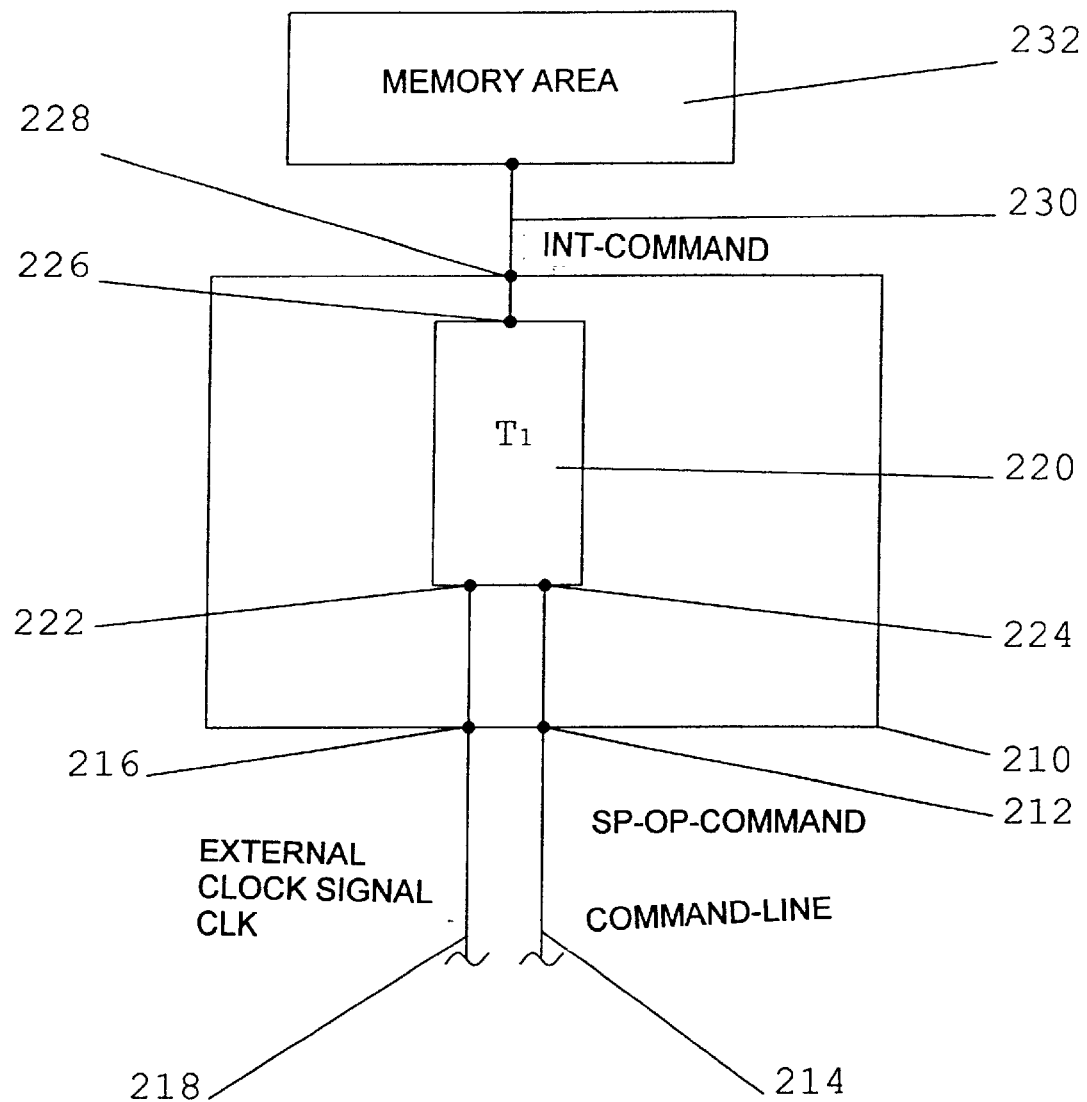
FIG. 2 shows a block diagram of an embodiment of the present invention.

In the following, a first embodiment of the present invention is discussed referring to FIG. 2. A command decoder 210 comprises a command input 212 connected to an external command line 214. Further, the command decoder 210 comprises a clock signal input 216 connected to a system clock line 218. The command decoder 210 further comprises an delay unit 220 comprising a clock signal input 222 and a command input 224. The clock signal input 222 of the delay unit 220 is connected to the clock signal input 216. Further, the command input 224 is connected to the input 212. The delay unit 220 further comprises an output 226 connected to an internal command output 228. The internal command output 228 is respectively connected to a memory system 232 via a command signal line 230. The memory system may for example be a DRAM memory, a SRAM (static random access memory) memory or a SDRAM (synchronous dynamic random access memory) memory, wherein the same may comprise several memory blocks.

In operation, a memory operation command SP-OP-COMMAND is applied to the command input 212 via the command line 214. The memory operation command SP-OP-COMMAND is input into the command input of the delay unit 220. Using the input command SP-OP-COMMAND and an external clock signal CLK which is for example a system clock signal, a command signal INT-COMMAND is generated in the delay unit 220.

The delay unit 220 is implemented such that the memory-internal command signal is generated at a time T1, wherein generating the command signal is performed according to the invention selectively synchronous to a rising or synchronous to a falling edge of the external clock signal applied to the clock signal input 222.

The generation of the memory-internal command signal selectively with the rising or the falling edge enables that the memory-internal command signal INT-COMMAND which may for example be an ACTIVATE command signal, a WRITE command signal, a READ command signal, a PRECHARGE command signal or a SENSE command signal is settable near the optimum time. In a preferred embodiment which is explained referring to FIG. 3, the setting of the time of generating the memory-internal command signal INT-COMMAND is performed in a programmable way using setting information which is input into the delay unit.

Consequently, with the inventive command decoder a high time accuracy and flexibility of the memory-internal command signals is achievable, whereby a memory operation is performable in a time effective way, i.e. with a low performing duration.

Figure 3:
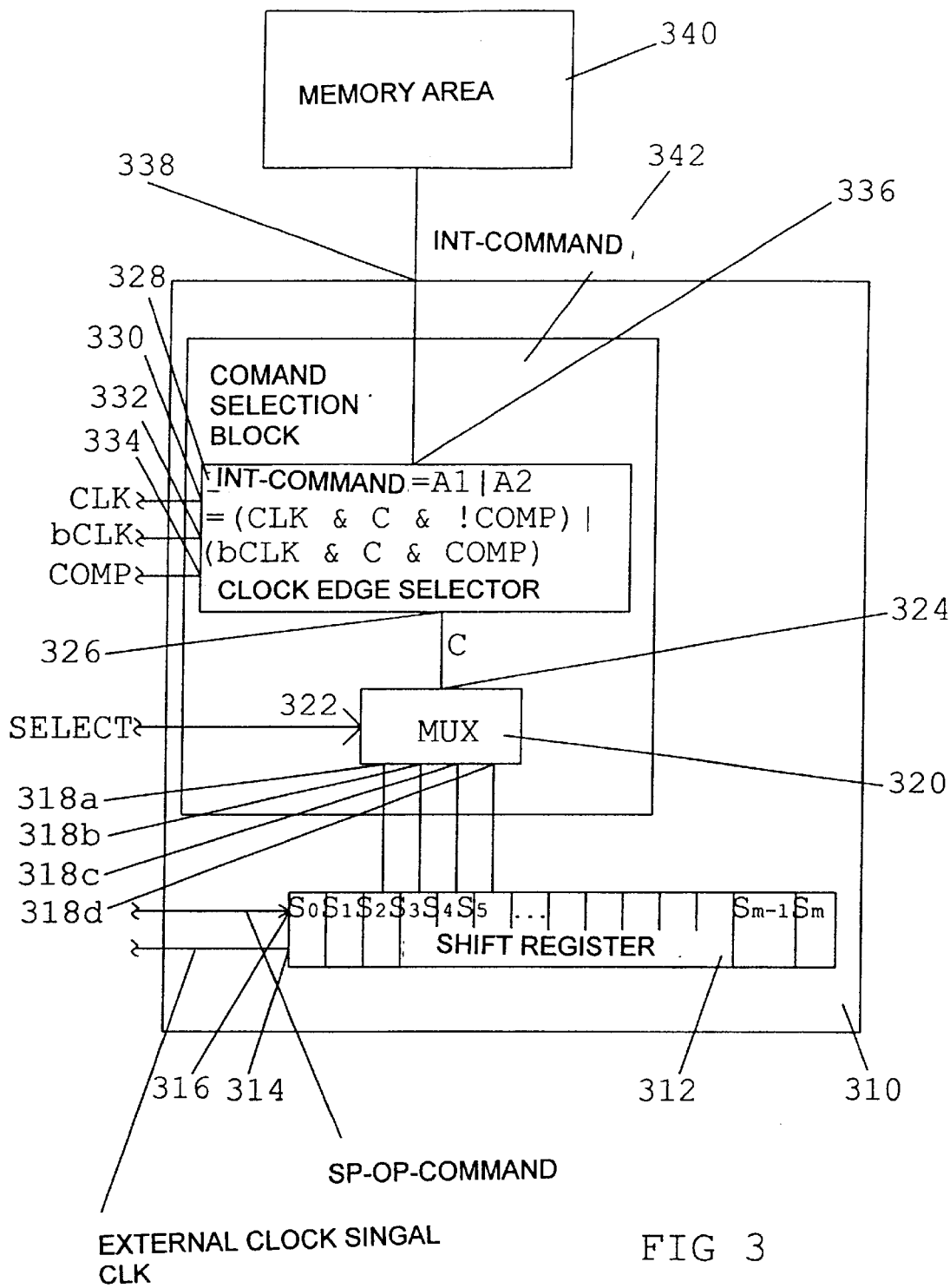
FIG. 3 shows a block diagram of a preferred embodiment of the present invention.

Referring to FIG. 3 a preferred embodiment of the present invention is now discussed.

According to FIG. 3, a command decoder comprises a shift register 312 which comprises a clock signal input 314 and a command input 316. The shift register 312 comprises a plurality m of memory units or flip-flops, respectively, wherein four successive memory units $S_2$, $S_3$, $S_4$ and $S_5$ are respectively connected to four inputs 318a–318d of a multiplexer or a TAP multiplexer 320 (TAP=terminal), respectively. The multiplexer 320 further comprises a selection input 322 which is implemented in order to receive an information signal representing a selection value. An output 324 of the multiplexer 320 is connected to an input 326 of a clock edge selector 328. The clock edge selector 328 comprises a first input 330 for receiving the external clock signal CLK, a second input 332 for receiving the inverted and/or complementary clock signal bCLK and a third input 334 for receiving a clock edge component signal COMP. An output 336 of the clock edge selector 328 is further connected to a command signal output 338 of the command decoder 310. The command output 338 is further respectively connected to an internal command line of a memory system or memory area 340. The multiplexer 320 and the clock edge selector 328 together form a command selection block 342, wherein its way of functioning is described in the following.

In an operation of the command decoder 310 a memory operation command SP-OP-COMMAND is applied to the command input 316 of the shift register 312. The memory operation command which may for example be a command SRAM-WRITE, a command SRAM-READ or a command REFRESH causes a value with a logical high state to be written into the first memory unit $S_0$ of the shift register 312, wherein before performing the writing the shift register 312 comprises an initial state in which all memory units comprise a logical low state.

After the memory unit $S_0$ is set to a logical high state the shift register is shifted one unit further with the next occurrence of the external clock signal CLK, i.e. in this embodiment with a rising edge of the external clock signal CLK, so that the value comprising a logical high state which is stored in the memory unit $S_0$ is shifted into the next memory unit $S_1$. Then, with the next rising clock edge, the shift register is shifted by a further unit so that the value comprising a logical high state which is stored in the memory unit $S_1$ is shifted into the memory unit $S_2$, etc. In an alternative embodiment the shift register is further implemented to perform the shifting in response to a falling edge of the external clock signal CLK.

In order to obtain a coarse setting of the delay time value or the command generating time with a time grid or "time pixel" of one period of the external clock signal, a selection value or selection signal SELECT is applied via the selection input 322 which sets one of the inputs 318a–318d of the multiplexer 320 in an active state, so that the value of the storage cell of the shift register 312 connected to the active-switched input is input in the multiplexer and applied to the output of the multiplexer. Consequently, at the time, at which the value with a high logical state generated by the memory operation command reaches the memory unit of the shift register, which is connected to the actively set output of the multiplexer 320, a signal C is generated at the output 324 of the multiplexer 320 at a time T1.

If, for example, a selection value SELECT is input in the selection input 322 which activates the input 318c connected to the memory unit $S_4$, then the signal C is generated at the output 324 of the multiplexer 320 at the time at which the logical high state is generated in the memory unit $S_4$ after four shifts.

In that each of the outputs 318a–318d is selectable by a proper value SELECT input to the selection input 322, it is enabled to generate the signal C in a programmable way within a predetermined range at different times. Consequently, the time of generating the signal C is settable with a time grid corresponding to a period length of the external clock signal, according to the above-described process.

If for example the memory operation command is applied to the shift register 312 at a time $t'_0$ and if at a time $t_0$ after the time $t'_0$ a rising edge of the external clock signal CLK occurs for the first time, then the signal C is generatable at a time $t_a$, a time $t_b$, a time $t_c$ or a time $t_d$ depending on the respective input selection value, wherein $t_a=t_0+2\Delta T$, $t_b=t_0+3\Delta T$, etc. and $\Delta T$ is the period length of the external clock signal. Consequently, the possible settable times are respectively different by a full period length $\Delta T$ of the external clock signal CLK.

The signal C which is generatable with a granularity or a time grid of a period length of the external clock signal CLK is applied to the input 326 of the clock edge selector 328 from the output 324 of the multiplexer 320 in order to perform a fine time setting selectively to a rising or a falling clock edge of the external clock signal CLK. To this end, the external clock signal CLK is input to the input 330, the inverse external clock signal bCLK is input to the input 332 and a clock edge component signal COMP is input into the input 334 for setting the clock edge.

The three signals CLK, bCLK and COMP are then subjected to a logical operation which causes that, depending on the applied clock edge component signal COMP, either a rising edge of the external clock signal CLK or a falling edge of the external clock signal CLK is used in order to generate the memory-internal command signal INT-COMMAND at the output 336 of the clock edge selector.

Therefore, a first value of the logical operation A1=CLK & C &!COMP is generated by AND-operations of the external clock signal CLK, the signal C and the inverse or complementary clock edge component signal !COMP. According to the operation the value A1 is only generated with a high value if all signals CLK, C and !COMP are at a logical high state.

Further, a second value of the logical operation A2=bCLK & C & COMP is generated by AND-operations of the inverse external clock signal bCLK with the signal C and the clock edge component signal COMP. Consequently, the value A2 is only set to a high value if all signals bCLK, C, COMP are at a logical high state.

By an OR-operation of the values A1 and A2, the memory-internal command signal INT-COMMAND is generated which is applied to an internal command line of the memory area 340 via the output 338.

For a better clarity of the above-described logical operations it is for example assumed that the clock edge component signal COMP just switched with a rising edge to a logical high state at the input 334. It is further assumed that the signal C is just generated at a logical high state with a rising edge so that a logical high state is applied to the input 326. As both signals C and CLK are at a high state it depends on the setting of the clock edge component signal COMP whether the memory-internal command signal INT-COMMAND is generated by the AND-operation A1.

If the clock edge component signal COMP is set to a logical low state, i.e. the inverse clock edge component signal !COMP lies on a logical high state, then the value A1 is set to a high value and the memory-internal command signal INT-COMMAND is generated.

Consequently, in case the value of the clock edge component signal COMP is set to a logical low value, the memory-internal command signal INT-COMMAND is generated synchronous with the rising edge.

Likewise, in case the clock edge component signal COMP is set to a logical high value, the memory-internal command signal INT-COMMAND is generated by generating the value A2 on a logical high level, which results when C and bCLK are at a logical high state.

Consequently, in case the signal COMP is set to a logical high state, the memory-internal command signal INT-COMMAND is generated synchronous with a rising edge of the inverse clock signal bCLK, i.e. synchronous with a falling edge of the clock signal CLK, if the signal C is on a logical high state.

Therefore, by setting the clock edge component signal COMP, it is possible to select whether the memory-internal command signal is generated after generating the signal C synchronous with a rising edge of the clock signal CLK or the inverse clock signal bCLK. As, by the control of the shift register 312, the signal C is synchronous to a rising edge of the external clock signal CLK, the memory-internal command signal INT-COMMAND generated by the clock edge selector 328 is shiftable with respect to the signal C depending on a respective set clock edge component signal COMP by a time period which corresponds to half of the clock period length of the external clock signal CLK.

Therefore, in this embodiment, with respect to the time of generating the memory-internal command signal INT-command, a coarse setting using a time grid of a period length of the external clock signal CLK is performed by inputting the first value SELECT at the input 322 of the multiplexer, while a fine setting to half a period length of the external clock signal CLK is performed by setting the second clock edge component signal COMP at the input 334 of the clock edge selector 328.

Thus, the command decoder 310 is fully programmable with a time grid of half a period length of the external clock signal CLK with respect to the time of generating the memory-internal command signal INT-command in a time range which is defined by the wiring of the multiplexer 322 with the shift register and the clock period of the external clock signal CLK by applying the select value SELECT to the selection input 322 and by applying the clock edge component signal COMP to the input 334.

This enables a simple setting of the time of generating the memory-internal command signal INT-COMMAND, which for example facilitates a testing of an optimum command generation time for a respective memory chip. Further, by the possibility of setting the memory-internal command signal to a rising edge or a falling edge of the external clock signal CLK a setting close to the optimum time is achieved.

Although the command decoder 310 merely comprises one command selection block 342, the command selection block 342 including the multiplexer 322 and the clock edge selector 328, several command selection blocks may be provided in further preferred embodiments in order to generate several memory-internal command signals.

Figure 4:
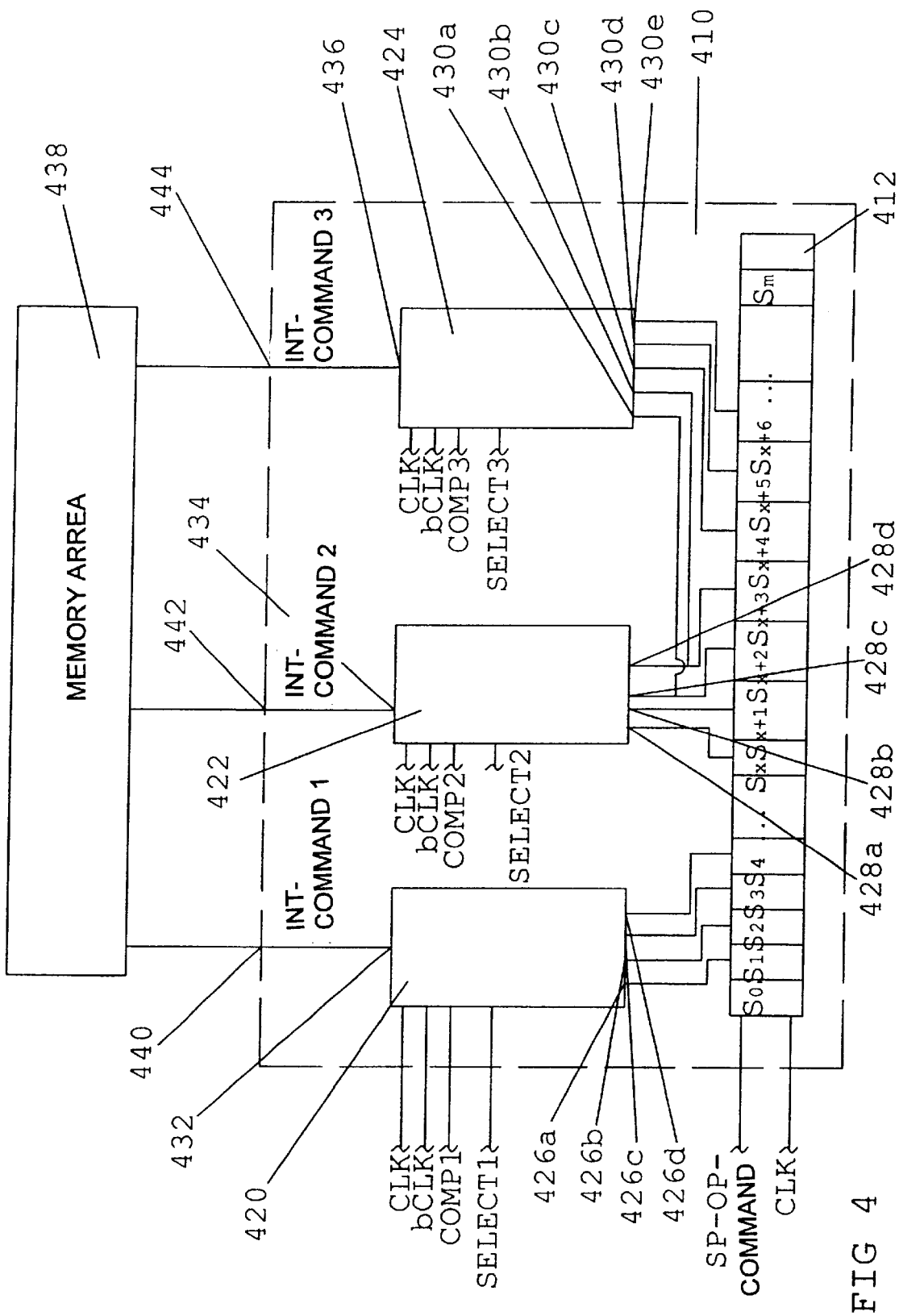
FIG. 4 shows a block diagram of a preferred embodiment for generating three memory-internal command signals.

In FIG. 4, for example, an embodiment is shown wherein a command decoder 410 comprises three command selection blocks 420, 422 and 424 for generating three memory-internal command signals. The construction of the individual command selection blocks 420, 422, 424, respectively, corresponds to the command selection block 342 according to FIG. 3, and therefore the construction and the functioning of the command selection blocks 420, 422, 424, respectively, is not further discussed at this point.

According to FIG. 4 the first command selection block 420 is connected to four register memory units or flip-flops of the shift register 412, i.e. more particular to the register memory units $S_1$, $S_2$, $S_3$ and $S_4$ via four outputs 426a–426d. Furthermore, four outputs of the second command selection block 422 are connected to four register memory units of the shift register 412, i.e. with the register memory units $S_x$, $S_{x+1}$, $S_{x+2}$ and $S_{x+3}$. Further, the third selection block 424 is connected to the register memory units $S_{x+2}$, $S_{x+3}$, $S_{x+4}$, $S_{x+5}$ and $S_{x+6}$ via five inputs 430a, 430b, 430c, 430d and 430e. Each of the command selection blocks 420, 422 and 424 comprises an output 432, 434, 436, respectively, wherein the same are connected to the respective internal command lines of a memory area 438.

According to the command selection block described referring to FIG. 3, the timings for generating memory-internal commands are controlled by entering signals or information SELECT1, SELECT2 and SELECT3 and COMP1, COMP2 and COMP3, respectively. The memory-internal command signals INT-COMMAND1, INT-COMMAND2 and INT-COMMAND3 generated by the command selection blocks 420, 422, 424, respectively, which are e.g. command signals selected from the group including an activate command, read command, write command, sense command or precharge command, are applied via outputs 440, 442, 444 to memory-internal lines associated with the respective memory-internal command signals.

In the embodiment according to FIG. 4 the memory unit $S_{x+3}$ is connected to the input 428d of the second command selection block 422 and to the input 430b of the third command selection block 424. Further, the memory unit $S_{x+2}$ is connected to the input 428c and to the input 430a. As the memory units $S_{x+2}$ and $S_{x+3}$ are connected to the second command selection block 422 as well as the third command selection block 424, the possible time ranges for setting the second memory-internal command signal INT-COMMAND2 and the third command signal INT-COMMAND3 also overlap. Consequently, it is possible by simultaneously activating the outputs 428c and 430a or the outputs 428b and 430b by the commands SELECT2 and SELECT3 and equally set signals COMP2 and COMP3 to generate the memory-internal command signals INT-COMMAND2 and INT-COMMAND3 at the same time. By simultaneously activating the inputs 428*d* and 430*a* it is further possible to generate the memory-internal command signal INT-COMMAND3 previous to the memory-internal command signal INT-COMMAND2.

Consequently, in comparison to known command decoders, a greater flexibility with respect to the generation of the memory-internal command signals is achieved by the inventive command decoder by the programmable setting of the delay.

Also, a large time range is achievable for a generating time of a memory-internal command signal by connecting a large number of register memory elements of the shift register to a command selection block.

For example, the command selection block 442 is connected to five register memory elements, whereas the command selection blocks 420 and 422 are only connected to four register memory elements, whereby the settable time range of the third command selection block 424 is increased compared to the second command selection block 422.

Further it is obvious for a person skilled in the art that instead of the three illustrated selection blocks for generating the memory-internal commands INT-COMMAND1, INT-COMMAND2, INT-COMMAND3 a higher or lower number of selection blocks may be used. For example, a command decoder may include five selection blocks in order to generate an ACTIVATE-command signal, a WRITE-command signal, a READ-command signal, a PRECHARGE-command signal and a SENSE-command signal.

One advantage of the inventive concept is that an extension which is for example necessary if an additional memory-internal command signal is needed for performing the memory operation may be readily carried out by adding an additional command selection block for the additional memory-internal command signal and connecting same with the corresponding register memory elements of the shift register. This open architecture concept facilitates the designing of command decoders for future memory systems.

What is claimed is:

1. A device for generating memory-internal command signals from a memory operation command, comprising:
 a command input for receiving the memory operation command for performing a memory operation in a memory system;
 a clock signal input for receiving an external clock signal;
 an output for applying a memory-internal command signal to a command signal line of the memory system; and
 a command signal generating means having an input for receiving a selection signal, the command signal generating means being implemented to generate the memory-internal command signal using the memory operation command at a time which is selectively settable and synchronous with a rising edge of the external clock signal when the selection signal is in a first state or synchronous to a falling edge of the external clock signal when the selection signal is in a second state.

2. The device according to claim 1, further including, in addition to the output for applying a memory-internal command signal to a command signal line of the memory system, at least one additional output for applying at least one further memory-internal command signal to one or several command signal lines of the memory system, and wherein the command signal generating means is implemented in order to generate at least one further memory-internal command signal in addition to one memory-internal command signal using the memory operation command at a time which depends on at least one further memory-internal command signal and which is selectively settable synchronous with the rising or synchronous to the falling edge of the external clock signal.

3. The device according to claim 1, wherein the command signal generating means comprises a first means which is implemented in order to generate a first signal using the external clock signal and the memory operation command at a first time synchronous to the rising edge of the external clock signal or synchronous to the falling edge of the external clock signal, and further comprises a second means which is implemented in order to generate the command signal selectively synchronous with the rising edge or synchronous with the falling edge of the external clock signal using the first signal.

4. The device according to claim 3, wherein the first means comprises an input for receiving a first information signal, wherein the first means is implemented in order to select the first time depending on the first information signal, and wherein the second means comprises an input for receiving a second information signal, wherein the second means is implemented in order to generate the time for generating the command signal using the second information signal.

5. The device according to claim 4, wherein the first means comprises:
 a shift register comprising several register memory units having associated register memory unit outputs, a first input connected to the command input and a second input connected to the clock signal input; and
 a multiplexer comprising an input for receiving the first information signal and further comprising at least a first input connected to one of the outputs of the register memory units of the shift register.

6. The device according to claim 4, wherein the second means comprises a logic circuit which is implemented in order to generate the memory-internal command signal using the external clock signal, an inverted external clock signal generated by an inversion from the external clock signal, the first signal generated by the first means and the second information signal.

7. The device according to claim 1, wherein the memory system is a memory system selected from the group consisting of a DRAM memory, a SPAN memory and a SDRAM memory.

8. The device according to claim 1, wherein the memory-internal command signal generated by the command signal generating means is selected from the group consisting of an activate command, a read command, a write command, a sense command and a precharge command.

* * * * *